(12) United States Patent
Thorner et al.

(10) Patent No.: US 9,165,709 B2
(45) Date of Patent: Oct. 20, 2015

(54) CURRENT TRANSFORMER

(75) Inventors: Carsten Thorner, Melle (DE);
Christoph Leifer, Bad Driburg (DE)

(73) Assignee: Phoenix Contact GmbH & Co KG, Blomberg (DE)

( * ) Notice: Subject to any disclaimer, the term of this patent is extended or adjusted under 35 U.S.C. 154(b) by 0 days.

(21) Appl. No.: 14/118,935

(22) PCT Filed: Apr. 24, 2012

(86) PCT No.: PCT/EP2012/001749
§ 371 (c)(1),
(2), (4) Date: Nov. 20, 2013

(87) PCT Pub. No.: WO2012/159698
PCT Pub. Date: Nov. 29, 2012

(65) Prior Publication Data
US 2014/0097924 A1    Apr. 10, 2014

(30) Foreign Application Priority Data

May 23, 2011    (DE) .......................... 10 2011 102 978

(51) Int. Cl.
*G01R 15/18*    (2006.01)
*H01F 38/30*    (2006.01)
(52) U.S. Cl.
CPC .............. *H01F 38/30* (2013.01); *G01R 15/186* (2013.01)
(58) Field of Classification Search
CPC ...... G01R 15/186; G01R 15/18; H01F 38/28; G01D 21/02
USPC ............................ 324/127, 126, 117 R, 117 H
See application file for complete search history.

(56) References Cited

U.S. PATENT DOCUMENTS 2,146,555 A * 2/1939 Arey .............................. 324/127
3,611,136 A * 10/1971 Ito et al. ........................ 324/127
(Continued)

FOREIGN PATENT DOCUMENTS

DE    4331265    3/1995
EP    060181    7/1994
(Continued)

OTHER PUBLICATIONS

International Search Report Int. Serial No. PCT/EP2012/001749 Filing Date: Apr. 24, 2012.
(Continued)

*Primary Examiner* — Tung X Nguyen
*Assistant Examiner* — Thang Le
(74) *Attorney, Agent, or Firm* — Reising Ethington PC

(57) ABSTRACT

A current measuring transducer for measuring the current flowing through an electrical cable, with a ring probe, a sensor and an evaluation device for recording the current value obtained by the ring probe and the sensor, wherein the ring probe has an annular core, wherein the ring probe is divided into a basic ring section and at least one movable ring section, wherein the movable ring section defines an open and a closed state, wherein in the open state, a radial cable insert opening is opened, and wherein a circularly closed arrangement is created in the closed state of the movable ring section in which the annular core surrounds the cable, wherein the radial insertion of a cable extending axially relative to the current measuring transducer into the inside area of the ring probe transfers the ring section from one to the other state, and measurement of the current in the cable inserted into the inside area is made possible in the closed state.

9 Claims, 6 Drawing Sheets

(56) References Cited

U.S. PATENT DOCUMENTS

| | | | | |
|---|---|---|---|---|
| 3,725,832 | A * | 4/1973 | Schweitzer, Jr. | 336/96 |
| 4,100,488 | A * | 7/1978 | Quietzsch et al. | 324/127 |
| 4,283,677 | A * | 8/1981 | Niwa | 324/127 |
| 4,518,913 | A | 5/1985 | Jackson | |
| 4,646,006 | A * | 2/1987 | Schweitzer, Jr. | 324/127 |
| 4,795,982 | A * | 1/1989 | Schweitzer, Jr. | 324/508 |
| 5,039,970 | A * | 8/1991 | Cox | 336/107 |
| 5,159,319 | A * | 10/1992 | Dunk et al. | 340/546 |
| 5,180,972 | A * | 1/1993 | Schweitzer, Jr. | 324/127 |
| 5,341,088 | A * | 8/1994 | Davis | 324/106 |
| 5,349,289 | A | 9/1994 | Shirai | |
| 5,381,123 | A | 1/1995 | Lefevre et al. | |
| 5,397,982 | A * | 3/1995 | Van Lankvelt | 324/126 |
| 5,475,371 | A * | 12/1995 | Dunk et al. | 340/660 |
| 5,483,215 | A * | 1/1996 | Mies | 336/176 |
| 5,889,399 | A * | 3/1999 | Schweitzer, Jr. | 324/133 |
| 6,333,634 | B1 * | 12/2001 | Haze et al. | 324/709 |
| 7,239,123 | B2 * | 7/2007 | Rannow et al. | 324/117 R |
| 7,663,459 | B2 * | 2/2010 | Horstmann | 336/30 |
| 8,594,956 | B2 * | 11/2013 | Banting et al. | 702/64 |
| 8,736,252 | B2 * | 5/2014 | Harkness et al. | 324/127 |
| 2008/0077336 | A1 * | 3/2008 | Fernandes | 702/57 |
| 2009/0066317 | A1 * | 3/2009 | de Buda | 324/103 R |
| 2012/0217963 | A1 * | 8/2012 | Naka et al. | 324/253 |
| 2012/0249118 | A1 * | 10/2012 | Haddon | 324/66 |

FOREIGN PATENT DOCUMENTS

| | | |
|---|---|---|
| EP | 0 999 565 A1 | 5/2000 |
| WO | WO 2006/122415 A1 | 11/2006 |
| WO | 2010042442 | 4/2010 |

OTHER PUBLICATIONS

International Written Opinion Int. Serial No. PCT/EP2012/001749 Filing Date: Apr. 24, 2012.

International Preliminary Report on Patentability Int. Serial No. PCT/EP2012/001749 Filing Date: Apr. 24, 2012.

German Office Action re: DE 10 2011 102 978.1.

EP Office Action, Serial No. 12 720 411.3-1560, Applicant: Phoenix Contact GmbH & Co. KG, Mail Date: Jul. 20, 2015.

* cited by examiner

CURRENT TRANSFORMER

TECHNICAL FIELD

The present disclosure relates to a current measuring transducer as well as a method of measuring current flowing through an electrical cable.

BACKGROUND

The amount of current flowing through an electrical cable is an important value to know for the use of a cable and for the operation of devices connected to it. On one hand, from the measured value the power transmitted through the cable can be closed, and on the other hand, such a measurement fulfills a safety aspect. Thus, power limits, the surpassing of which could, for example, overload the cable or the device connected to the cable, can be monitored by means of the current measuring transducer. The cable cross-sectional area and assembly determine the acceptable power capacity of the cable.

Current measurements as such are known for a cable through which an electrical current flows. For an example of such, patent document DE 689 09 847 T2 gives an electrical measuring transducer with a coil that is arranged around the electrical conductor wherein the conductor is guided centrally through the coil.

Mainly, current measuring methods for an electrical cable can be distinguished into those measuring methods that require an electrical measuring element in the electrical conductor and those methods that infer the electrical current flowing through the electrical cable from an electrical or magnetic field surrounding an electrical conductor. Such an element that, for example, is inserted into the electrical conductor is a shunt resistor.

Measuring methods that manage without such an inserted element, on the other hand, measure inductively.

Current measuring transducers, as are known in prior art, are typically pushed onto the electrical cable. In this way, an inductive element encloses the electrical cable and enables a measurement by means of the current measuring transducer. The precise placement of a prior art current measuring transducer on the desired location proves to be difficult. A subsequent placement on an existing, already laid cable, or the simple exchange of a current measuring transducer, moreover, is typically not possible.

Existing solutions in order to enable a subsequent placement of a current measuring transducer on an electrical cable do not have a circularly closed ring that is arranged around the electrical cable in a ring-shaped manner. Also, the introduction of the electrical cable into the device becomes difficult.

GENERAL DESCRIPTION PRESENT DISCLOSURE

Therefore, an object of the present disclosure may include providing a current measuring transducer that minimizes or solves the abovementioned problem.

A further object of the present disclosure may include allowing a simple installation of the current measuring transducer on an already laid electrical cable.

Yet another object of the present disclosure may include providing a current measuring transducer that has an improved bundling of the magnetic flux.

One or more objects of the present disclosure may be realized by the subject matter of the independent claims. Further embodiments of the present disclosure are defined in the dependent claims.

According to the present disclosure, a current measuring transducer for measuring the current flowing through the electrical cable is provided with a ring probe. The ring probe has an annular core inside it, which allows a bundling of the magnetic field prevailing around the electrical cable through which current is flowing. Through the bundling of the magnetic field in the annular core, an increase of the magnetic flux density is achieved, which significantly increases the precision of measurement.

The electrical cable can be introduced into the ring probe radially from the side. In order to allow an opening of the ring probe, the ring probe, besides a basic ring section, also has a movable ring section, wherein the movable ring section defines an open and a closed state.

The ring probe is formed particularly as a ring with an axial opening inside of the ring probe. In the open state of the movable ring section, a radial cable entry opening is opened so that the electrical cable can be brought radially into the inside area of the current measuring transducer. In particular, the pressure on the cable on the movable ring section of the ring probe transfers the movable ring section from the closed to the open state, for example by a simple pivoting. Inserting the electrical cable into the inside area of the ring probe can also transfer the movable ring section from the open to the closed state, when, for example, the movable ring section is opened before inserting the cable; the movable ring section is kept in the open state, and inserting the cable into the inside area of the ring probe releases a closing operation that is caused, for example, by means of a resetting spring.

In another embodiment of the present disclosure, a transfer of the closed to the open state when inserting the cable and an automatic transfer to the closed state after bringing in the cable is done. As an example, this is achieved as impressing the movable ring section exerts a resetting force on the movable ring section and as soon as the cable has passed the movable ring section the movable ring section is reset self-acting to the closed state.

Once the electrical cable is in the inside area of the ring probe, wherein the ring probe is in the closed state, current measuring on the cable is enabled. Furthermore, the closed state of the movable ring section causes a ring-shaped closed arrangement around the electrical cable in which the annular core encloses the cable and the magnetic flux is closed around the electrical cable.

The current measuring transducer according to the present disclosure also contains a sensor.

The sensor is designed to record the magnetic flux density bundled through the ring probe and thereby also reinforced, for example, by means of a Hall sensor or a magnetoresistive sensor. The ring probe and sensor together form thereby a measuring unit. The sensor is positioned directly on or in the annular core.

Further, there is in the current measuring transducer an evaluation unit for recording the current values received by the ring probe and the sensor. The evaluation unit is designed to calculate the current flowing through the electrical cable from the magnetic flux density detected with the ring probe and the sensor.

In a preferred embodiment, the current measuring transducer includes a spring element that elastically exerts tension on the movable ring section against the basic ring section in the closed state and thus keeps it in the closed state. By means of radial pressure acting on the movable ring section the movable ring section is opened against the elastic tension; it closes automatically when the cable is fully inserted into the inner area of the sensor ring and the separation point in the ring probe is closed.

The separation point also disrupts the annular core arranged in the ring probe whereby the annular core has front sides turned towards the other section respectively on both sections of the annular ring separated by the separation point, which lie flatly on each other when the ring probe, and thereby the annular ring, is in the closed state.

By means of a spring element, the tension of the movable ring section supports a tight fit of the movable ring section on the basic ring section, so that a gap in the magnetic field can be avoided.

In a further embodiment, the current measuring transducer has an actuating section in its inside area. In the open state of the movable ring section, the movable ring section releases the cable insert opening and by means of radial pressure acting on the actuating section the movable ring section closes self-acting when the cable is fully inserted into the inner area of the sensor ring.

The current measuring transducer is therefore designed to be self-retaining in the open state as well as in the closed state. In other words, the current measuring transducer has a bistable state that allows the movable ring section to remain in an open as well as closed state. As an example, this is achieved by a bistable spring element.

The ring probe can include a hinge that is placed between the basic ring section and the movable ring section in such a way that the movable ring section can be pivoted transversely to the cable axis.

For example, the hinge is designed such that the movable ring section can be pivoted transversely to the cable axis inwardly. This form of construction allows the automatic release of the cable insert opening when an electrical cable presses on the movable ring section.

The movable ring section can also be constructed to slide along the ring probe's girth, whereby the exertion of radial pressure on the movable ring section shifts the movable ring sections into the open position. By means of the ring probe being constructed to be able to slide, greater pressure of the movable ring section on the basic ring section can be produced, if needed, as the spring element used for that can produce the force, for example the reset force, in a tangential direction to the ring probe.

In a preferred embodiment, the ring probe has two movable ring sections constructed symmetrically to each other wherein the movable ring sections in the open state open the radial cable insert opening between the movable ring sections. This form of construction can also allow the automatic withdrawal of the cable. If a hinge is used, this is, for example, designed so as to fold in both directions. Besides the easier release of the radial cable insert opening with a ring probe, which includes two movable ring sections, the insertion of an electrical cable of larger diameter is allowed in this form of construction. Nearly the whole inside area of the current measuring transducer can such be filled by a cable, thereby reducing the size of the current measuring transducer, if need be.

For example, the automatic withdrawal of the cable from the inside area of the current measuring transducer is also enabled with two movable rings sections constructed symmetrically to each other. If the movable ring sections have hinges, then these may also operate in both directions.

In another embodiment, such a current measuring transducer has two spring elements that, in the closed state, exert a spring tension on the movable ring sections against each other so that the cable insert opening is released by the exertion of radial pressure on the movable ring sections. When the cable is radially inserted completely into the inside area of the current measuring transducer, the closed state is automatically engaged. In other words, the movable ring sections then snap shut self-acting as soon as the cable has passed the movable ring sections, and they are no longer pressed upon or checked by the cable against the spring tension.

The springs can be common spiral springs. Preferably, the springs are annular springs directly integrated in the hinges.

The current measuring transducer preferably includes a dielectric housing. The housing can involve a basic housing section for accommodation of the evaluation device and the sensor as well as a housing for the annular core that belongs to the ring probe. In other words, the ring probe preferably includes an enclosure and an annular ring placed in the enclosure. The enclosure and the basic housing section may be made jointly in one piece, for instance molded.

The dielectric housing can be equipped with means of fastening the housing to an exterior object. The placement of the sensor in or on the ring probe is to be chosen upon consideration of economic and measurement-taking aspects.

The sensor may be realized as a Hall sensor that is inserted into the annular core at a separation point of the annular core so that the magnetic flux flowing through the Hall sensor can be measured. In this case, the annular core functions as a Hall probe.

The annular core is made of susceptible material. Such material is suited to conducting the field surrounding the cable and bundling it, if necessary. Measurement with a sensor and an annular core allows more precise results than measurement without such an annular ring.

In a further embodiment, the sensor is constructed as a magnetoresistive sensor that is placed directly on the annular ring and connected with the evaluation device.

In the following, the present disclosure will be explained more closely by exemplary embodiments and in reference to the drawings wherein the same and similar elements are partly provided with same reference numbers, and the features of the various embodiments can be combined with each other.

BRIEF DESCRIPTION OF THE FIGURES

They show.

DETAILED DESCRIPTION OF THE FIGURES

Figure 1:
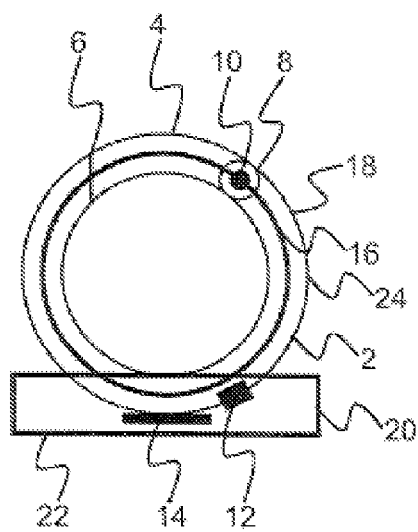
FIG. 1 an embodiment of the current measuring transducer of the present disclosure with a hinge, FIG. 2 another embodiment of the current measuring transducer with two movable ring sections, FIG. 2a insertion process of a cable into the embodiment in FIG. 2, FIG. 2b insertion process of a cable into the embodiment in FIG. 2, FIG. 2c insertion process of a cable into the embodiment in FIG. 2, cable completely inserted into the inside area, FIG. 2d withdrawal process of a cable from the embodiment in FIG. 2, FIG. 2e withdrawal process of a cable from the embodiment in FIG. 2, cable completely withdrawn, FIG. 3 an embodiment of the present disclosure with sliding multi-plane ring, FIG. 4 detail view of the multi-plane, FIG. 5 another embodiment of the current measuring transducer with actuator section, FIG. 6 an embodiment of the current measuring transducer with hinges placed directly on the housing section.

FIG. 1 shows a first embodiment of the inductive current measuring transducer. A part of the basic ring section 2 as well as the evaluation device 14 is embedded in the basic housing section 22. The remaining part of the ring probe 18 is enclosed by an enclosure 24, so that the entire annular core 16 is enclosed. The basic housing section 22 and enclosure 24 together make up the housing 20.

A sensor 12 is fastened on the basic ring section 2 and typically placed in the basic housing section 22. A hinge 8 with a spring element 10, here a torsion spring or a spiral spring, is placed in the basic ring section 2. By means of the hinge 8, a movable ring section 4 can be moved so that the spiral spring 10 exerts a reset force on the movable ring section 4. Radial impression from outside on the movable ring section 4 moves the movable ring section 4 from the closed to the open position. For the sake of simplicity, the application of radial force on the movable ring section 4 can take place by the cable 30 itself. Once the cable 30 is inserted completely into the inside area of the current measuring transducer, for example the ring probe 18, the movable ring section 4 closes self-acting, whereby the movable ring section 4 automatically snaps shut by means of the spiral spring 10, therefore returning to the closed state.

If a cable 30 is placed into the current measuring transducer and an electrical current flows through the cable 30, a magnetic field is created in the immediate surroundings of the electrical cable 30. The ring probe 18, which includes an annular core 16, can bundle magnetic field lines by a suitable choice of the geometry of the ring probe 18. The sensitivity of the current measuring transducer is thereby increased. A current measurement is made possible of smaller electrical conductors and/or weaker electrical currents.

The movable ring section 4 thus allows the easy insertion and withdrawal of the electrical cable 30.

Figure 2:
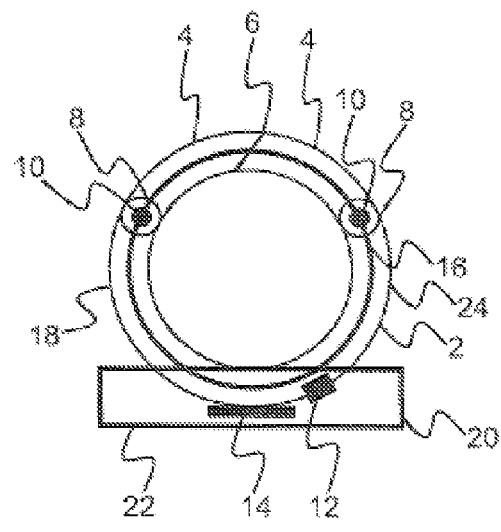

FIG. 2 shows a preferred embodiment of the present disclosure. Here, two movable ring sections 4 are provided to be radially rotating or pivoting on the basic ring section 2 by means of hinges 8. A reset of the movable ring sections 4 is carried out by spiral springs 10 placed in the hinges 8, which is comparably to the embodiment shown in FIG. 1. The use of two movable ring sections 4 simplifies the insertion and withdrawal of the electrical cable 30 and allows use of larger cable diameters. Alternatively, this can reduce the size of the entire current measuring transducer. As in FIG. 1, a sensor 12 as well as an evaluation device 14 is placed in a housing 20 and there typically in a basic housing section 22. The basic ring section 2 is fastened on or in the basic housing section 22.

FIGS. 2a to 2e demonstrate the principle of inserting a cable 30 into the inside area of the current measuring transducer in reference to the embodiment shown in FIG. 2.

Figure 2A:
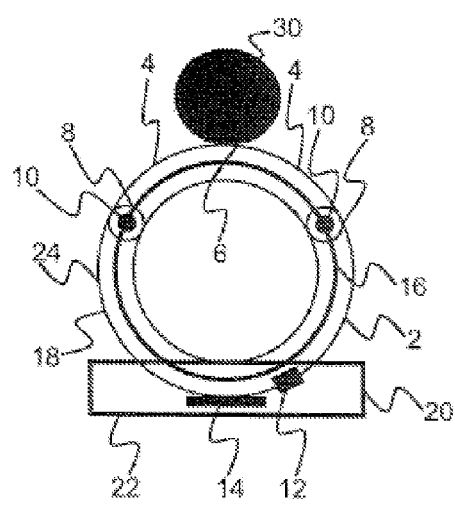

FIG. 2a shows the current measuring transducer with a cable applied from the outside. Radial pressure, from a direction which is above in FIG. 2, makes the movable ring sections 4 swing inward, whereby the special configuration of the separation point 6 prevents the two movable ring sections 4 from snagging against each other by means of the inclined frontal ends of the movable ring sections 4.

Figure 2B:
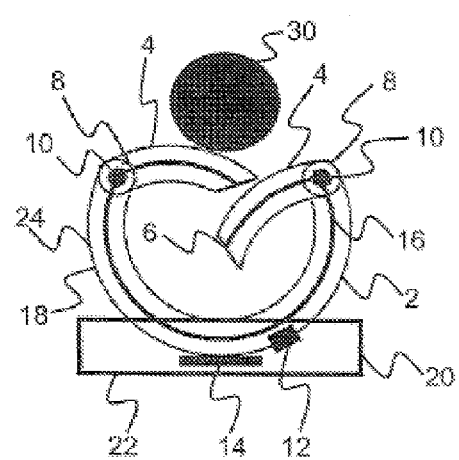

FIG. 2b shows the gradual insertion of the cable 30 into the inside area of the current measuring transducer, wherein the movable ring sections 4 make way for the radial pressure that can be exerted by the cable 30, and swing further into the inside area of the current measuring transducer. The cable insert opening is thereby opened further while the spring elements 10 gather a reset force on the movable ring elements 4 in the direction of the closed state.

Figure 2C:
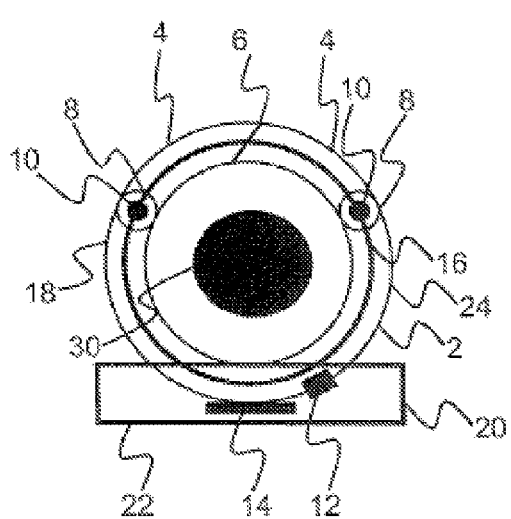

FIG. 2c shows the cable 30 completely inserted into the inside of the current measuring transducer whereas the movable ring sections 4 have already swung back to the closed state. In other words, the cable insert opening is snapped shut by means of the reset force of the spring elements 10 which transferred the movable ring sections 4 back into the closed state.

Figure 2D:
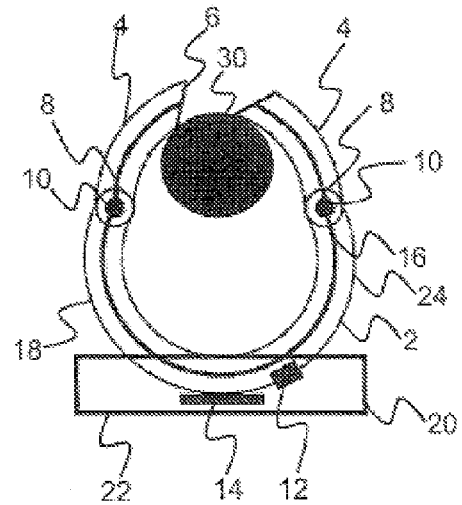

FIG. 2d shows the withdrawal process of a cable 30 from the current measuring transducer. The radial impression of the cable 30 on the movable ring sections 4 from the inside area of the current measuring transducer makes the movable ring sections move apart from each other, by which the spring elements 10 again exert a reset force on the movable ring sections 4. In other words, the cable 30 is pressed from the inside area against the reset force of the spring elements 10 on the movable ring sections 4, and thus the cable insert opening is opened.

Figure 2E:
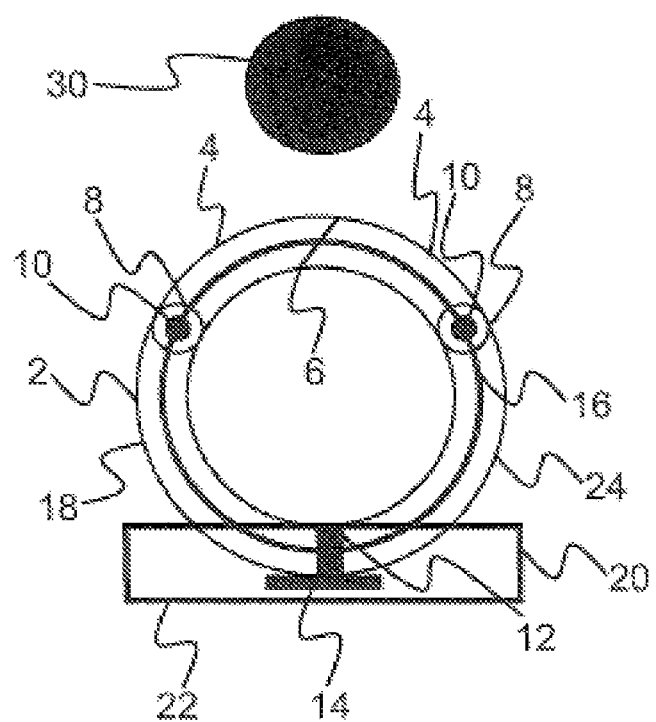

FIG. 2e shows the cable 30 completely withdrawn from the current measuring transducer. The movable ring sections are snapped shut again self-acting into the closed state by means of the reset force of the spring elements 10.

Further, FIG. 2e shows an alternative placement of the sensor 12. For example, if the sensor 12 is a Hall sensor 12, it is placed on a separation point in the annular core 16 so the magnetic flux through the annular core 16 also flows through the Hall sensor 12.

Figure 3:
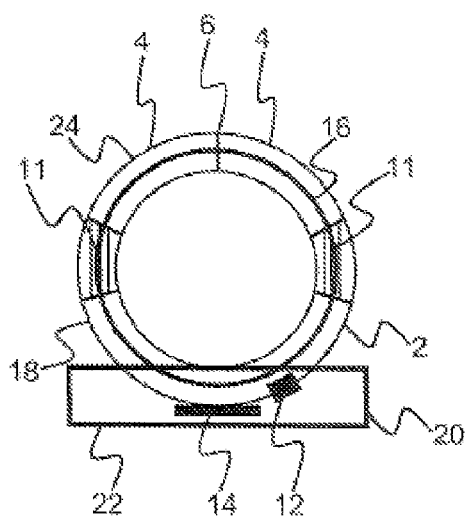

FIG. 3 shows another embodiment of the present disclosure. Here, the ring probe 18 has two movable ring sections 4 that slide tangentially relative to the circumference of the ring probe. The annular core 16 has interlocking blades 11 in order to maintain thus the magnetic flux through the annular core 16 in spite of the sliding design of the ring probe 18. The exertion of radial pressure on the movable ring sections 4 transfers the movable ring sections 4 from the closed to open state analogous to the description of the previous figures, wherein the interlocking blades 11 are slid together and thus open a cable insert opening. The reset into the closed state occurs automatically by means of the spring elements 10, which are placed between or on the interlocking blades 11 as soon as the cable is inserted completely into the inside area of the current measuring transducer. This embodiment of the present disclosure has the advantage that no projecting parts are included in the opening area or the outer area of the current measuring transducer. By means of the slide-open mechanism no different materials disturbing the magnetic flux are included in the ring probe 18 whereby the sensitivity of the current measuring transducer can be further increased. The interlocking blades 11 can be therefore regarded as part of the annular core.

Figure 4:
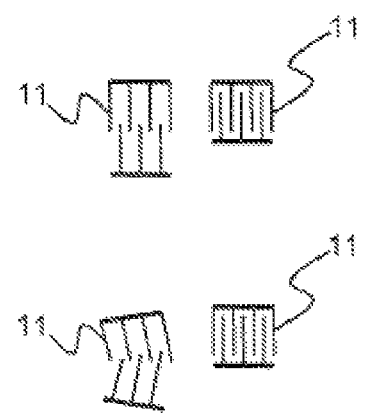

FIG. 4 shows a detailed view of the interlocking blades used in FIG. 3. The left-hand illustration shows the closed position of the movable ring sections, and the right-hand illustration shows the open position, respectively. The interlocking blades are pressed together by which a ring section is opened.

Figure 5:
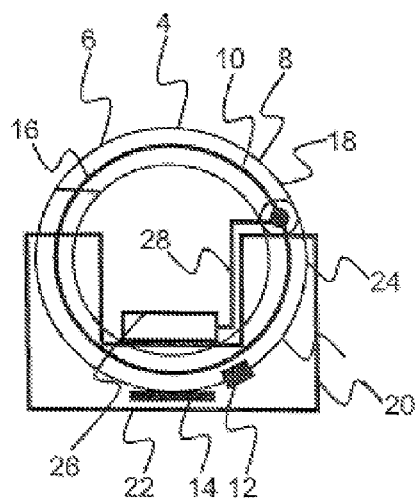

FIG. 5 shows a current measuring transducer with a movable ring section 4 and an actuating section 26. The movable ring section 4 is first opened and locks in an open position, while a reset force acts upon the movable ring section by means of a spiral spring 10 arranged in the hinge 8. With the insertion of the electrical cable into the inside area of the current measuring transducer, the actuating section 26 is pressure activated by the cable. An operative connection 28 between the actuating section 26 and the hinge 8, for example a joint or another flexible connection, opens the catch mechanism of the movable ring section 4 and transfers the movable ring section 4 automatically into the closed state. If this embodiment of the present disclosure is shipped in the open state, then an especially easy insertion of the electrical cable into the inside area of the current measuring transducer is made possible. For the complete and automatic closing of the movable ring section, only pressure on the actuating section 26 by means of the electrical cable is needed. If necessary, upon the closing of the current measuring transducer, the movable ring section 4 locks onto the basic ring section 2 of the ring probe 18 so that the unqualified user finds it difficult to open. This locking can be arranged on the separation point 6.

In all of the embodiments, the closed arrangement shows a highly circular closed state. Such an arrangement, dependent on the magnetic field surrounding the electrical cable, is particularly suited for a sensitive measurement of the electrical current flowing through the electrical cable.

The circular annular core 16 arranged in the ring probe bundles this magnetic field and increases its measurability. The field intensity is measured in the annular core by the sensor 12. By means of the evaluation device 14 the value obtained at the sensor 12 is transformed into a readable value. This can be a digital value, but an analog voltage value is also possible. A direct evaluation in the current measuring transducer is also possible: transmission of the values obtained is possible over a wireless communications connection, for example.

The arrangement with a movable ring section also allows a subsequent installation of a current measuring transducer onto an already installed electrical line in a particularly easy manner.

The sensor 12 is for example a Hall sensor for measuring the magnetic field in the annular core of the ring probe. For the placement of the Hall sensor 12 in the ring probe 18, there is provided in the annular core 16 in the area of the basic housing section 22 a slit in the annular core 16 into which slit the Hall sensor 12 is inserted.

The sensor 12 is, for example, a magnetoresistive sensor arranged in the ring probe. The magnetoresistive sensor 12 is arranged preferably in the area of the basic housing section 22 directly on the annular core 16. The sensor 12, particularly the Hall sensor 12 or the magnetoresistive sensor 12, is directly connected with the evaluation device 14. Even with the use of a magnetoresistive sensor 12 is the use of an annular core 16 in the ring probe 18 advantageous, since this measuring method also attracts the magnetic field around the electrical cable.

Figure 6:
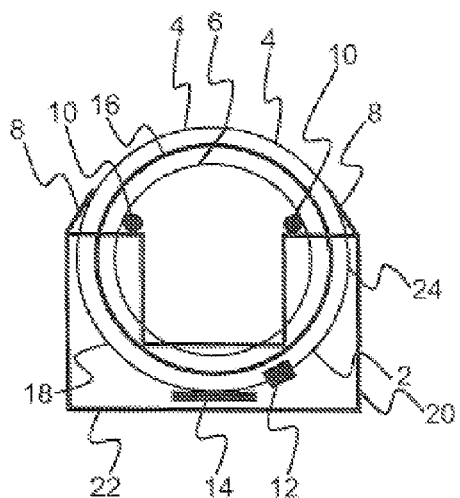

Finally, FIG. 6 shows an embodiment of the present disclosure in which the hinge 8 is placed on or in the basic housing section 22. Placement of the hinge 8 outside of the ring probe 18 allows the annular core 16 to be kept free of other materials which may be required for the installation of the hinge 8 and may disturb the magnetic field. The hinge 8 in the embodiment shown in FIG. 6 is therefore arranged outside of the ring probe 18, at least outside of the annular core 16. The spring element 10 for producing a reset force on the movable ring element 4 is then installed on the housing 20, particularly on the basic housing section 22. The insertion of the electrical cable 30 into the inside area of the current measuring transducer in this case also transfers the movable ring section 4 from the closed to the open state. Once the electrical cable 30 completely passes the movable ring section 4 and is therefore inserted into the inside area of the ring probe 18 of the current measuring transducer, the movable ring section 4 is automatically transferred back to the closed state by means of the spring element 10: it snaps shut.

It will be evident to the person skilled in the art that the embodiments described herein are to be understood as examples, and that the invention is not limited to these, but can be varied in multiple ways without going beyond the invention. Further, it is evident that the features, regardless of whether they are disclosed in the description, the claims, the figures or elsewhere, each define components of the present disclosure even if they are described together in common with other features.

The invention claimed is:

1. A current measuring transducer for measuring the current flowing through an electrical cable, wherein the transducer comprises:
   a ring probe,
   a magnetoresistive sensor, and
   an evaluation device for calculating the values obtained by the magnetoresistive sensor,
   wherein the ring probe contains an annular core,
   wherein the ring probe is divided into a basic ring section and at least one movable ring section,
   wherein the movable ring section defines an open and closed state, and in the open state a radial cable insert opening is opened, and in the closed state of the movable ring section a closed arrangement is created in which the annular core surrounds the cable,
   wherein the ring probe with the basic ring section and the movable ring section defines a circular arrangement,
   wherein radial insertion of the cable extending axially to the current measuring transducer into the inside area of the ring probe pivots the movable ring section inwardly from one state to the other and, in the closed state, measurement of the current in the cable inserted into the inside area is made possible.

2. The current measuring transducer of claim 1, wherein the current measuring transducer contains a spring element which in the closed state creates a spring tension of the movable ring section against the basic ring section, wherein, by application of radial pressure upon the movable ring section, said movable ring section opens against the spring tension and automatically closes when the cable is radially inserted completely into the inside area.

3. The current measuring transducer of claim 1, wherein the movable ring section is designed to slide along the circumference of the ring probe and the exertion of radial pressure on the movable ring section slides the movable ring section into the open position.

4. The current measuring transducer of claim 1, further including a dielectrical housing for containing the evaluation device, the magnetoresistive sensor and the annular core and/or having means of fastening the housing.

5. A current measuring transducer for measuring the current flowing through an electrical cable, wherein the transducer comprises:
   a ring probe,
   a magnetoresistive sensor, and
   an evaluation device for calculating the values obtained by the magnetoresistive sensor,
   wherein the ring probe contains an annular core,
   wherein the ring probe is divided into a basic ring section and at least one movable ring section,
   wherein the movable ring section defines an open and closed state, and in the open state a radial cable insert opening is opened, and in the closed state of the movable ring section a circularly closed arrangement is created in which the annular core surrounds the cable,
   wherein radial insertion of the cable extending axially to the current measuring transducer into the inside area of the ring probe transfers the movable ring section from one state to the other and, in the closed state, measurement of the current in the cable inserted into the inside area is made possible, an actuation section arranged in an inside area of the current measuring transducer, wherein the current measuring transducer is constructed to be locking in the open state as well as the closed state, wherein the movable ring section opens the cable insert opening in the open state and the movable ring section closes automatically by exertion of radial pressure on the actuating section by overcoming the locking force as soon as the cable is inserted into the inside area and the actuating section is activated.

6. A current measuring transducer for measuring the current flowing through an electrical cable, wherein the transducer comprises:

a ring probe, a magnetoresistive sensor, and an evaluation device for calculating the values obtained by the magnetoresistive sensor, wherein the ring probe contains an annular core, wherein the ring probe is divided into a basic ring section and at least one movable ring section, wherein the movable ring section defines an open and closed state, and in the open state a radial cable insert opening is opened, and in the closed state of the movable ring section a closed arrangement is created in which the annular core surrounds the cable, wherein the ring probe with the basic ring section and the movable ring section defines a circular arrangement, wherein radial insertion of the cable extending axially to the current measuring transducer into the inside area of the ring probe transfers the movable ring section from one state to the other and, in the closed state, measurement of the current in the cable inserted into the inside area is made possible, wherein the ring probe contains a hinge arranged between the basic ring section and the movable ring section, such that the movable ring section is pivotable transversely to the cable axis by the hinge.

7. The current measuring transducer of claim 6, wherein the hinge is constructed in such a manner that the movable ring section is arranged to pivot inward transversely to the cable axis by the hinge.

8. A current measuring transducer for measuring the current flowing through an electrical cable, wherein the transducer comprises:

a ring probe, a magnetoresistive sensor, and an evaluation device for calculating the values obtained by the magnetoresistive sensor, wherein the ring probe contains an annular core, wherein the ring probe is divided into a basic ring section and at least one movable ring section, wherein the movable ring section defines an open and closed state, and in the open state a radial cable insert opening is opened, and in the closed state of the movable ring section a circularly closed arrangement is created in which the annular core surrounds the cable, wherein radial insertion of the cable extending axially to the current measuring transducer into the inside area of the ring probe transfers the movable ring section from one state to the other and, in the closed state, measurement of the current in the cable inserted into the inside area is made possible, wherein the ring probe contains two movable ring sections constructed symmetrically to each other, wherein the movable ring sections in the open state open the radial cable insert opening between the movable ring sections.

9. The current measuring transducer according to claim 8, wherein the current measuring transducer contains two spring elements that exert spring tension on the movable ring sections against each other in the closed state so that the cable insert opening is opened by the exertion of radial pressure on the movable ring section and, when the cable is radially inserted completely into the inside area, the movable ring sections are transferred into the closed state by the springs.

* * * * *